United States Patent
Huang et al.

(10) Patent No.: US 11,448,331 B2
(45) Date of Patent: Sep. 20, 2022

(54) HEAT DISSIPATION ASSEMBLY

(71) Applicant: GIGA-BYTE TECHNOLOGY CO., LTD., New Taipei (TW)

(72) Inventors: Shun-Chih Huang, New Taipei (TW); Tai-Chuan Mao, New Taipei (TW); Yi-Jhen Lin, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 503 days.

(21) Appl. No.: 16/586,915

(22) Filed: Sep. 28, 2019

(65) Prior Publication Data

US 2020/0208748 A1 Jul. 2, 2020

(30) Foreign Application Priority Data

Dec. 26, 2018 (TW) ................... 107147118

(51) Int. Cl.
*G05D 15/00* (2006.01)
*F16K 17/00* (2006.01)
(Continued)

(52) U.S. Cl.
CPC .......... *F16K 17/003* (2013.01); *F16K 11/168* (2013.01); *F16K 27/12* (2013.01);
(Continued)

(58) Field of Classification Search
CPC ...... F16K 17/003; F16K 11/168; F16K 27/12; F16K 39/045; F28F 13/08; F28F 27/02; F28F 2250/04; H05K 7/2039
(Continued)

(56) References Cited

U.S. PATENT DOCUMENTS 4,187,688 A * 2/1980 Berg ..................... F25B 27/007
126/714
2009/0200007 A1 8/2009 Foy et al.
(Continued)

FOREIGN PATENT DOCUMENTS

DE 102017109890 11/2018
EP 2851949 3/2015
(Continued)

OTHER PUBLICATIONS

"Search Report of Europe Counterpart Application", dated May 27, 2020, p. 1-p. 7.
(Continued)

*Primary Examiner* — Davis D Hwu
(74) *Attorney, Agent, or Firm* — JCIPRNET (57) ABSTRACT

A heat dissipation assembly includes a case and a partition structure. The case has a chamber. The partition structure includes a partition wall vertically disposed in the chamber to separate a first flow path and a second flow path in the chamber, and the partition wall has a breach and a valve structure disposed at the breach, wherein the valve structure covers the breach when the valve structure is not pushed open. When a fluid pressure existed in a section of one of the first flow path and the second flow path which is adjacent to the valve structure is greater than a fluid pressure existed in a section of the other one of the first flow path and the second flow path which is adjacent to the valve structure, the valve structure is pushed away to expose at least a part of the breach.

9 Claims, 7 Drawing Sheets

(51) Int. Cl.
  *F16K 11/16*  (2006.01)
  *F16K 27/12*  (2006.01)
  *F16K 39/04*  (2006.01)
  *F28F 13/08*  (2006.01)
  *F28F 27/02*  (2006.01)
  *H05K 7/20*  (2006.01)

(52) U.S. Cl.
  CPC ............ *F16K 39/045* (2013.01); *F28F 13/08* (2013.01); *F28F 27/02* (2013.01); *F28F 2250/04* (2013.01); *H05K 7/2039* (2013.01)

(58) Field of Classification Search
  USPC ....................................................... 165/281
  See application file for complete search history.

(56) References Cited

U.S. PATENT DOCUMENTS

2014/0138075 A1    5/2014    Yang et al.
2016/0126160 A1    5/2016    Jeong

FOREIGN PATENT DOCUMENTS

TW        I431737      3/2014
TW        I453573      9/2014
TW        M554513      1/2018

OTHER PUBLICATIONS

"Office Action of Taiwan Counterpart Application", dated Mar. 9, 2020, p. 1-p. 4.

* cited by examiner

HEAT DISSIPATION ASSEMBLY

CROSS-REFERENCE TO RELATED APPLICATION

This application claims the priority benefit of Taiwan application Ser. No. 107147118, filed on Dec. 26, 2018. The entirety of the above-mentioned patent application is hereby incorporated by reference herein and made a part of this specification.

BACKGROUND OF THE INVENTION

1. Field of the Invention

The present invention relates to a heat dissipation assembly, and in particular, to a heat dissipation assembly that utilizes liquid for heat conduction.

2. Description of Related Art

Today's computer gamers focus on good computer performance, and high-performance computer parts require higher power consumption. In a high-speed computing environment, the operating temperature of high power consuming computer parts increases, which affects the operational fluency of a computer system. A water-cooled heat dissipation assembly is one of the common heat dissipation methods, mainly absorbs the heat energy of a heat source (such as a motherboard, a central processing unit or a display chip) via liquid, then discharges the heat-absorbed liquid for heat exchange cooling, and performs cyclic heat dissipation accordingly.

Besides, the temperature of the heat source (such as the motherboard, the central processing unit or the display chip) is generally affected by the amount of cooling liquid flow. As the flow rate is higher, the heat conduction capability is better. The existing water-cooled heat dissipation assembly is usually limited by the space limitation of the heat source, such as uneven width of flow paths often occurs. When liquid flows from a wider flow path to a narrower flow path, the problem of large flow resistance may be caused, thus affecting the heat dissipation efficiency of the heat dissipation assembly.

SUMMARY OF THE INVENTION

The present invention provides a heat dissipation assembly that directs liquid diversion to reduce the probability of non-smooth flow due to excessive flow resistance.

The heat dissipation assembly of the present invention includes a case and a partition structure. The case has a chamber. The partition structure includes a partition wall vertically disposed in the chamber to separate a first flow path and a second flow path in the chamber, and the partition wall has a breach and a valve structure disposed at the breach, wherein the valve structure covers the breach when the valve structure is not pushed open. When a fluid pressure existed in a section of one of the first flow path and the second flow path which is adjacent to the valve structure is greater than a fluid pressure existed in a section of the other one of the first flow path and the second flow path which is adjacent to the valve structure, the valve structure is pushed away to expose at least a part of the breach.

In an embodiment of the present invention, the aforementioned first flow path may have a first section and a second section. A flow path width of the first section of the first flow path is greater than a flow path width of the second section of the first flow path. The valve structure may be located at a portion of the first section adjacent to the second section, or the valve structure may be located at a boundary between the first section and the second section.

In an embodiment of the present invention, the aforementioned valve structure includes two valve plates. When the valve structure is pushed away, the two valve plates may be opened in the same direction and stretch into the first flow path together or stretch into the second flow path together.

In an embodiment of the present invention, when the valve structure is pushed away, one of the two valve plates is opened and stretches into the first flow path or the second flow path.

In an embodiment of the present invention, the heat dissipation assembly may further include at least one first stop structure, disposed on at least one of the first flow path and the second flow path to limit an angle at which the two valve plates are opened.

In an embodiment of the present invention, the heat dissipation assembly may further include at least one second stop structure, disposed beside the two valve plates to limit a direction in which the two valve plates are opened.

In an embodiment of the present invention, the two valve plates are flexible and fixed to the partition wall.

In an embodiment of the present invention, the two valve plates are hard valve plates and pivotally connected to the partition wall.

In an embodiment of the present invention, a ratio of a length of each valve plate to a flow path width of the first flow path may be between 0.2 and 0.6, and a ratio of the length of each valve plate to a flow path width of the second flow path may be between 0.2 and 0.6.

In an embodiment of the present invention, the two valve plates are adapted to be moved from a closed position to a maximum open position, and each valve plate has a first side connected to the partition wall and a second side opposite to the first side. A position of the second side when the valve plate is located at the maximum open position and a position of the second side when the valve plate is located at the closed position are spaced by a distance, a ratio of the distance to a flow path width of the first flow path may be between 0.2 and 0.6, and a ratio of the distance to a flow path width of the second flow path may be between 0.2 and 0.6.

Based on the above, the heat dissipation assembly of the present invention is provided with a valve structure on a partition structure separating a first flow path and a second flow path. The valve structure can be pushed away and closed with the magnitudes of liquid pressures in the first flow path and the second flow path. A part of fluid thus flows from a breach to the other flow path to achieve the effect of diversion, thereby reducing a fluid pressure in one of the flow paths and making liquid flow smoothly. Moreover, a part of heat carried by the liquid flowing through a heat source on an original flow path will be discharged out of a chamber in advance via the diversion effect of the valve structure, thereby accelerating partial fluid circulation and improving the heat dissipation efficiency.

In order to make the aforementioned and other objectives and advantages of the present invention comprehensible, embodiments accompanied with figures are described in detail below.

DESCRIPTION OF THE EMBODIMENTS

Figure 1:
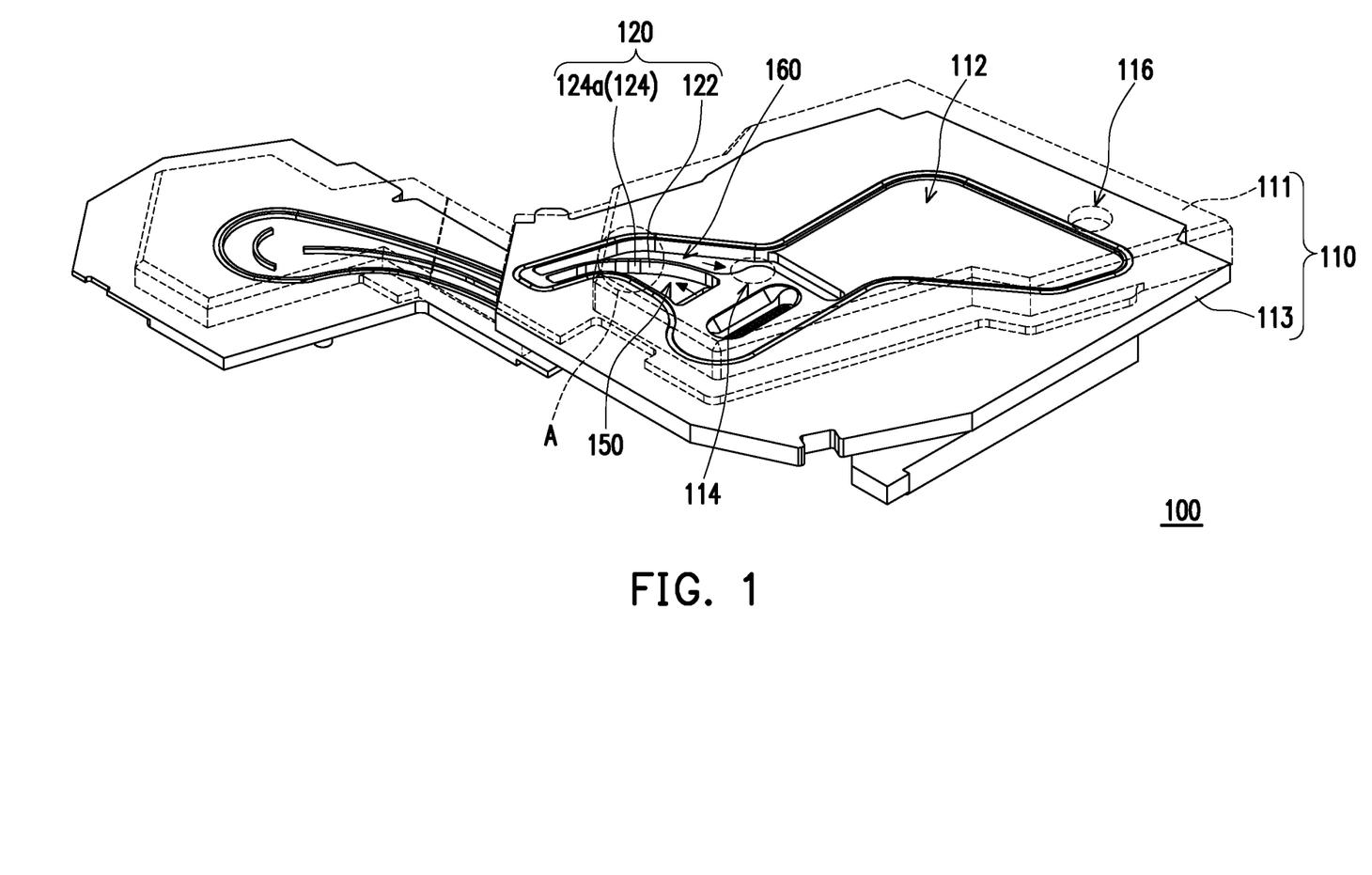
FIG. 1 is an appearance stereogram of a heat dissipation assembly according to an embodiment of the present invention.

FIG. 1 is an appearance stereogram of a heat dissipation assembly according to an embodiment of the present invention. Referring to FIG. 1, a heat dissipation assembly 100 is adapted to dissipate heat from a heat source (not shown), where the heat source may be, for example, a central processing unit (CPU), a memory, a southbridge chip, a northbridge chip, or a graphic chip on a computer motherboard. In the present embodiment, the heat dissipation assembly 100 has a case 110 and a partition structure 120 disposed in the case 110. The case 110 has an upper housing 111 and a lower housing 113, a chamber 112 being formed between the upper housing 111 and the lower housing 113. The upper housing 111 includes a first water hole 114 and a second water hole 116. In the heat dissipation assembly 100 of FIG. 1, the upper housing 111 is indicated by a dashed line in order to clearly show the internal configuration of the case 110.

In the present embodiment, the partition structure 120 includes a partition wall 122 vertically disposed in the chamber 112 of the case 110, and the partition wall 122 of the partition structure 120 separates the chamber 112 into a first flow path 150 and a second flow path 160. Besides, the first flow path 150 is in communication with the second flow path 160. Liquid may enter the first flow path 150 from the first water hole 114, flow from the first flow path 150 to the second flow path 160, and then flow from the second flow path 160 to the second water hole 116. Besides, the present embodiment is exemplified by the liquid entering from the first water hole 114 into the chamber 112 and flowing out from the second water hole 116. In other embodiments, the liquid may also flow in a reverse direction, which depends on the usage habits of a user and is not limited here.

It is worth mentioning that during the liquid flow, since the cross-sectional area of a flow path changes, for example, since flow paths have different widths (from a wide flow path to a narrow flow path) or there is an obstacle in a flow path (for example, the flow path has a structure such as a fin that may block the liquid flow or the flow path has a height difference), the flow resistance may be increased to make liquid difficult to pass. The partition structure 120 of the heat dissipation assembly 100 of the present embodiment is provided with a valve structure 124, and fluid pressures in the first flow path 150 and the second flow path 160 can be adjusted to make liquid flow smoothly. This will be explained below.

Figure 2:
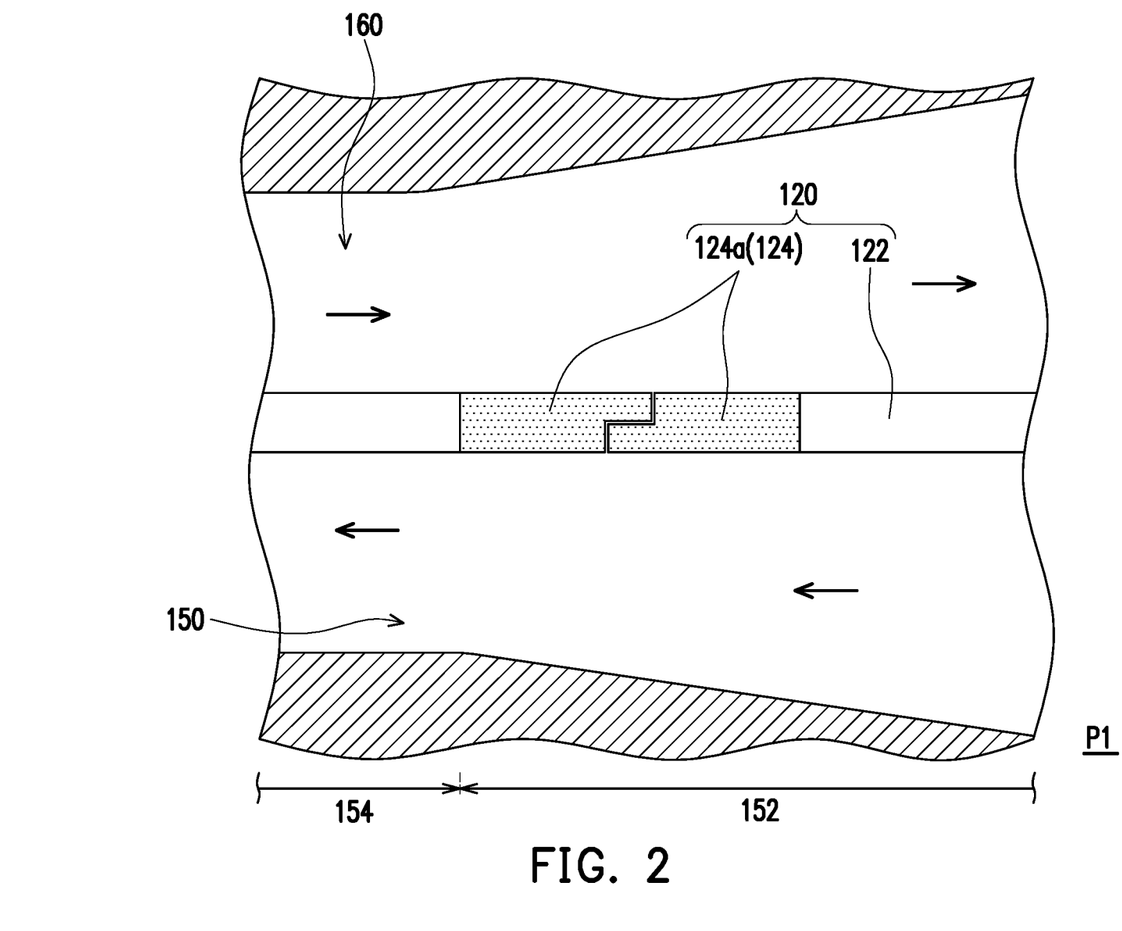
FIG. 2 is an enlarged top view of a region A of the heat dissipation assembly of FIG. 1.
Figure 3:
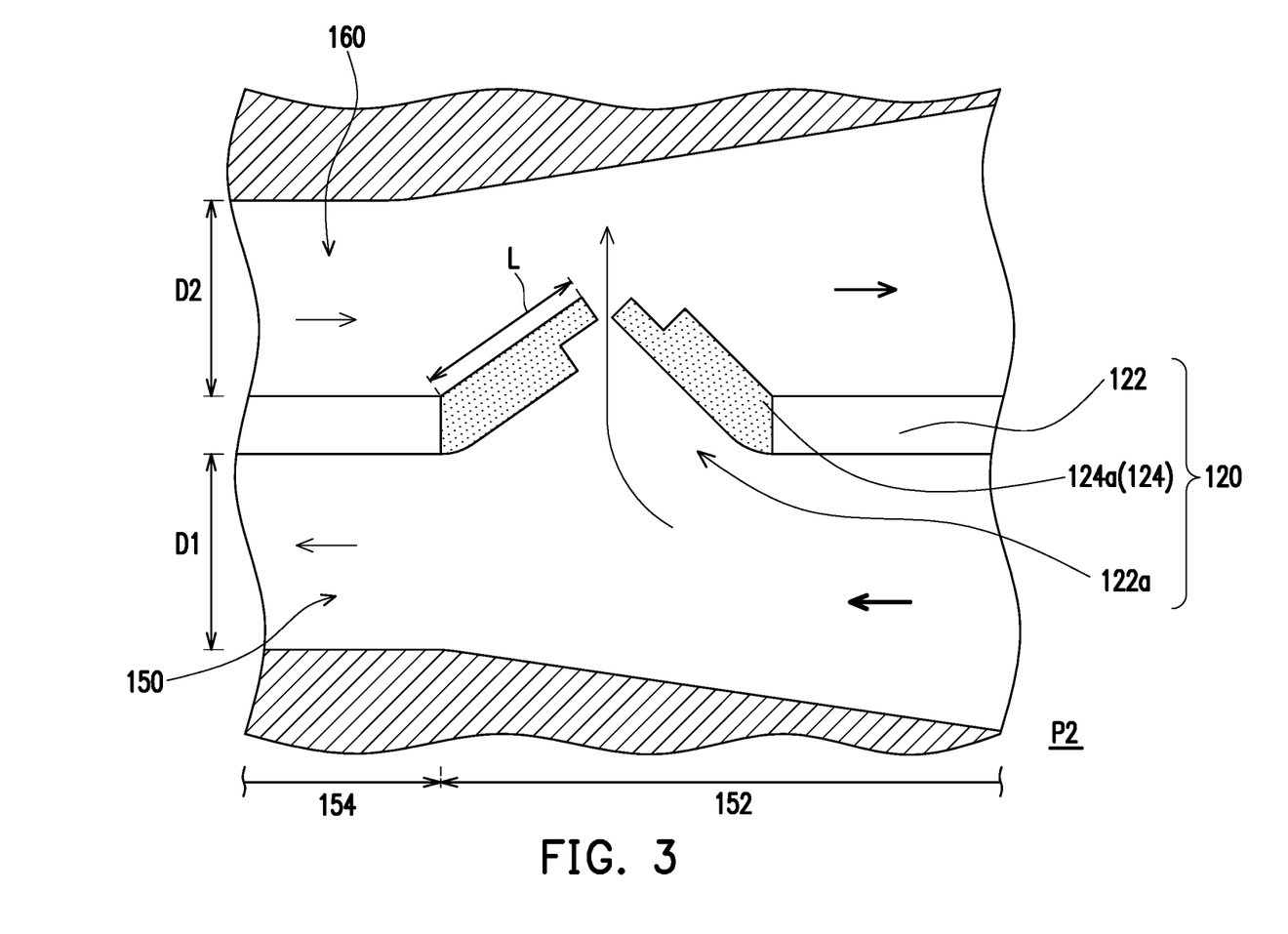
FIG. 3 is a schematic view of an opened valve structure of the heat dissipation assembly of FIG. 2.

FIG. 2 is an enlarged top view of a region A of the heat dissipation assembly of FIG. 1. FIG. 3 is a schematic view of an opened valve structure of the heat dissipation assembly of FIG. 2. Referring to FIG. 2 and FIG. 3, in the present embodiment, the first flow path 150 has a first section 152 and a second section 154. In the present embodiment, the partition wall 122 also has a breach 122a (FIG. 3) and a valve structure 124 disposed at the breach 122a. Of course, in other embodiments, the valve structure 124 of the present invention is not only applicable to the heat dissipation assembly 100 as shown in FIG. 1.

In the present embodiment, the valve structure 124 on the partition wall 122 of the partition structure 120 is located at a portion of the first section 152 of the first flow path 150 adjacent to the second section 154 of the first flow path 150. In other embodiments, the valve structure 124 on the partition wall 122 may also be located at a boundary between the first section 152 of the first flow path 150 and the second section 154 of the first flow path 150.

Besides, in the present embodiment, a flow path width of the first section 152 of the first flow path 150 is greater than a flow path width of the second section 154 of the first flow path 150. Thus, in the present embodiment, when a fluid flows from the first section 152 of the first flow path 150 to the second section 154 of the first flow path 150, when the liquid flows, the flow resistance increases due to the decrease of the flow path width, and further, the pressure of the fluid also increases. Of course, in other embodiments, the flow resistance in the first flow path 150 may be affected by a structure such as a fin provided in the second section 154 of the first flow path 150, and the present invention is not limited thereto.

In contrast, in the present embodiment, since the fluid flow direction of the second flow path 160 is opposite to the liquid flow direction of the first flow path 150, the flow path width of the second flow path 160 gradually increases with the flow direction. Thus, in the present embodiment, since the size of the second flow path 160 increases, the flow resistance at the time of liquid flow decreases, and further, the pressure of the fluid also decreases.

In the present embodiment, the valve structure 124 includes two valve plates 124a. When the valve structure 124 is pushed away, the two valve plates 124a may be opened in the same direction and stretch into the first flow path 150 or the second flow path 160, so that the two valve plates 124a are adapted to be moved from a closed position P1 to a maximum open position P2.

Further, as shown in FIG. 3, when a fluid pressure existed in a section of the first flow path 150 adjacent to the valve structure 124 is greater than a fluid pressure existed in a section of the second flow path 160 adjacent to the valve structure 124, the valve structure 124 will be pushed away by a fluid, and the two valve plates 124a stretch together into the second flow path 160, so that at least a part of the breach 122a is exposed, and a part of liquid can flow from the first flow path 150 to the second flow path 160 via the breach 122a, and is discharged from the second water hole 116 along the liquid flow direction of the second flow path 160.

Similarly, in other embodiments, if a fluid pressure existed in a section of the second flow path 160 adjacent to the valve structure 124 is greater than a fluid pressure existed in a section of the first flow path 150 adjacent to the valve structure 124, the valve structure 124 will be pushed away by a fluid, the two valve plates 124a stretch together into the first flow path 150, and at least a part of the breach 122a is exposed, so that a part of liquid can flow from the second flow path 160 to the first flow path 150 via the breach 122a.

In the present embodiment, the valve structure 124 is disposed at the breach 122a on the partition wall 122 of the heat dissipation assembly 100, the valve structure can be pushed away and closed with the magnitudes of liquid pressures in the first flow path 150 and the second flow path 160. A part of fluid thus flows through the breach to achieve the effect of diversion, thereby reducing a fluid pressure in one of the flow paths and making liquid flow smoothly. Moreover, a part of heat carried by the liquid flowing through a heat source on an original flow path will be discharged out of a chamber in advance via the diversion effect of the valve structure, thereby accelerating partial fluid circulation and improving the heat dissipation efficiency.

Besides, in the embodiment, the material of the valve plate 124a is a flexible material, such as rubber, and the two valve plates 124a are both fixed to the partition wall 122, for example, by injection molding. In this embodiment, if the material of the valve plate 124a is rubber, when the valve structure 124 is pushed away by liquid, the valve plate 124a may exhibit a slight deformation and a bent state and expose a part of the breach 122a to allow a part of liquid to flow. Of course, in other embodiments, the material of the valve plate 124a may also be other suitable designs, and the present invention is not limited thereto.

Referring to FIG. 3, in the present embodiment, the valve plate 124a of the valve structure 124 also has a length L, a ratio of the length L of each valve plate 124a to a flow path width D1 of the first flow path 150 may be, for example, between 0.2 and 0.6, and a ratio of the length L of each valve plate 124a to a flow path width D2 of the second flow path 160 may be, for example, between 0.2 and 0.6. Such a design can ensure that the first flow path 150 or the second flow path 160 is not closed or blocked when the valve plate 124a is flipped and/or opened, thereby avoiding the problem of reduction of the heat dissipation efficiency of the heat dissipation assembly 100 caused by non-smooth liquid flow or liquid reflow due to blocking of a flow space of liquid in the first flow path 150 or the second flow path 160.

It is to be noted that the following embodiments use the same reference numerals and partial contents of the foregoing embodiments, where the same reference numerals are used to designate the same or similar components, and the description of the same technical content is omitted. For the description of the omitted portions, reference may be made to the foregoing embodiments, and the following embodiments are not repeated.

Figure 4:
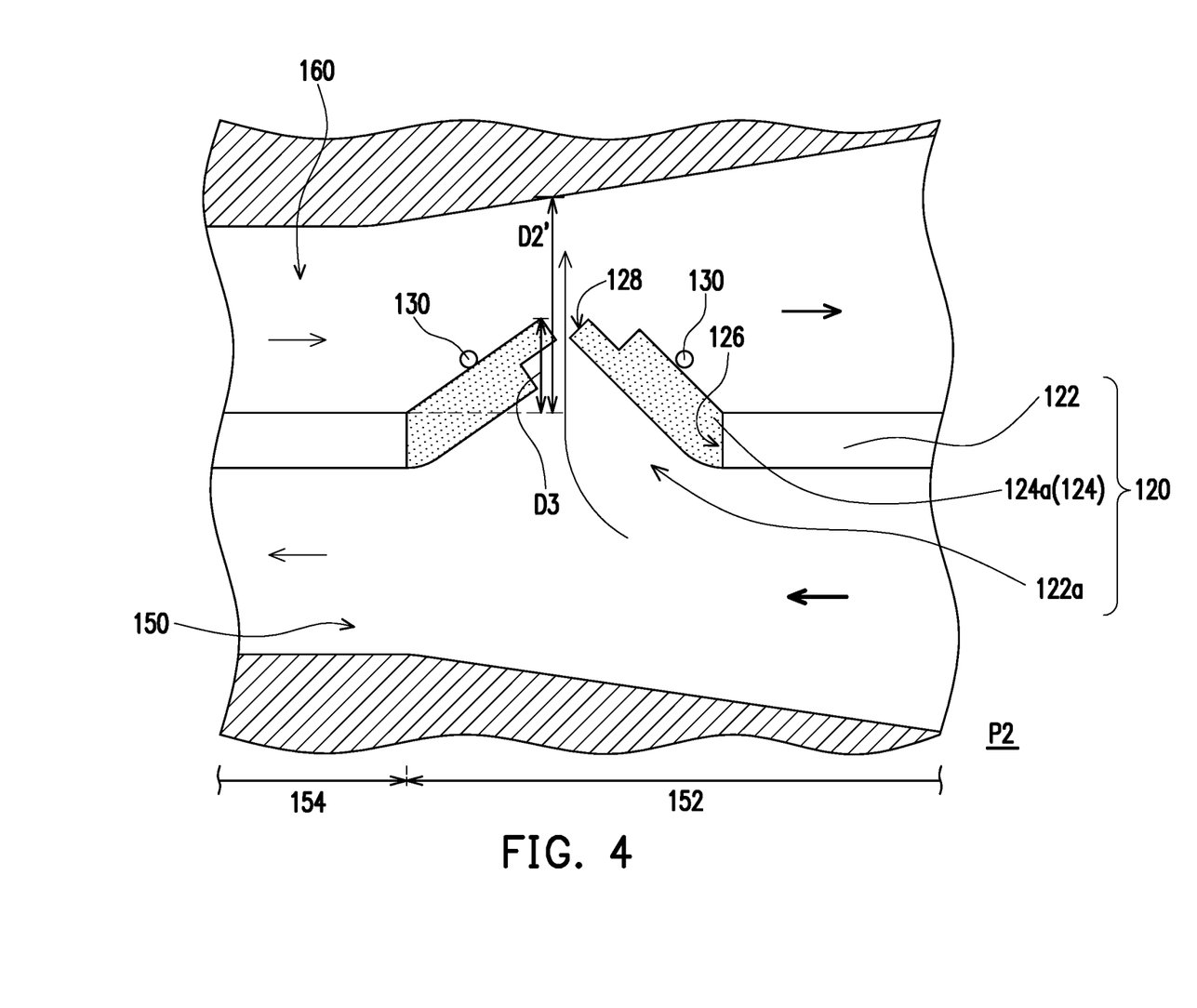
FIG. 4 is a partial top view of an opened valve structure of a heat dissipation assembly according to another embodiment of the present invention.

FIG. 4 is a partial top view of an opened valve structure of a heat dissipation assembly according to another embodiment of the present invention. As shown in FIG. 4, the main difference between FIG. 4 and FIG. 3 is that, in the present embodiment, the heat dissipation assembly 100 further includes a first stop structure 130, disposed on the second flow path 160 for limiting a maximum angle at which the valve plate 124a is opened. For example, when the two valve plates 124a stretch into the second flow path 160 at the same time, the first stop structure 130 limits the maximum angle at which the valve plate 124a is opened, so that the valve plate 124a can only be pushed to the maximum open position P2 without being over-opened. Of course, in other embodiments, the first stop structure 130 may also be disposed in the first flow path 150. Or, the first stop structure 130 is disposed in the first flow path 150 and the second flow path 160 respectively. The present invention is not limited thereto. In addition, the first stop structure 130 may be a convex structure disposed on the upper housing 111 or the lower housing 113 or a columnar structure connecting the upper housing 111 and the lower housing 113.

Besides, in the present embodiment, each valve plate 124a further has a first side 126 connected to the partition wall 122 and a second side 128 opposite to the first side 126. When the valve plate 124a is moved from the closed position P1 to the maximum open position P2 limited by the first stop structure 130, the position of the second side 128 of the valve plate 124a at the maximum open position P2 and the position of the second side 128 of the valve plate 124a at the closed position P1 as shown in FIG. 3 are spaced by a distance D3, that is, a projection distance of the second side 128 with respect to the breach 122a. In the present embodiment, when the valve plate 124a stretches into the second flow path 160 and is opened to the maximum open position P2, a ratio of the distance D3 to a corresponding flow path width of the second flow path 160 (e.g., a width D2' of the second flow path 160 at the second side 128 of the valve plate 124a) is between 0.2 and 0.6. Thus, the valve plate 124a does not block an excessive flow path space of the second flow path 160, thereby avoiding influence on the heat dissipation efficiency of the heat dissipation assembly 100 (FIG. 1) caused by non-smooth liquid flow or liquid reflow.

Figure 5:
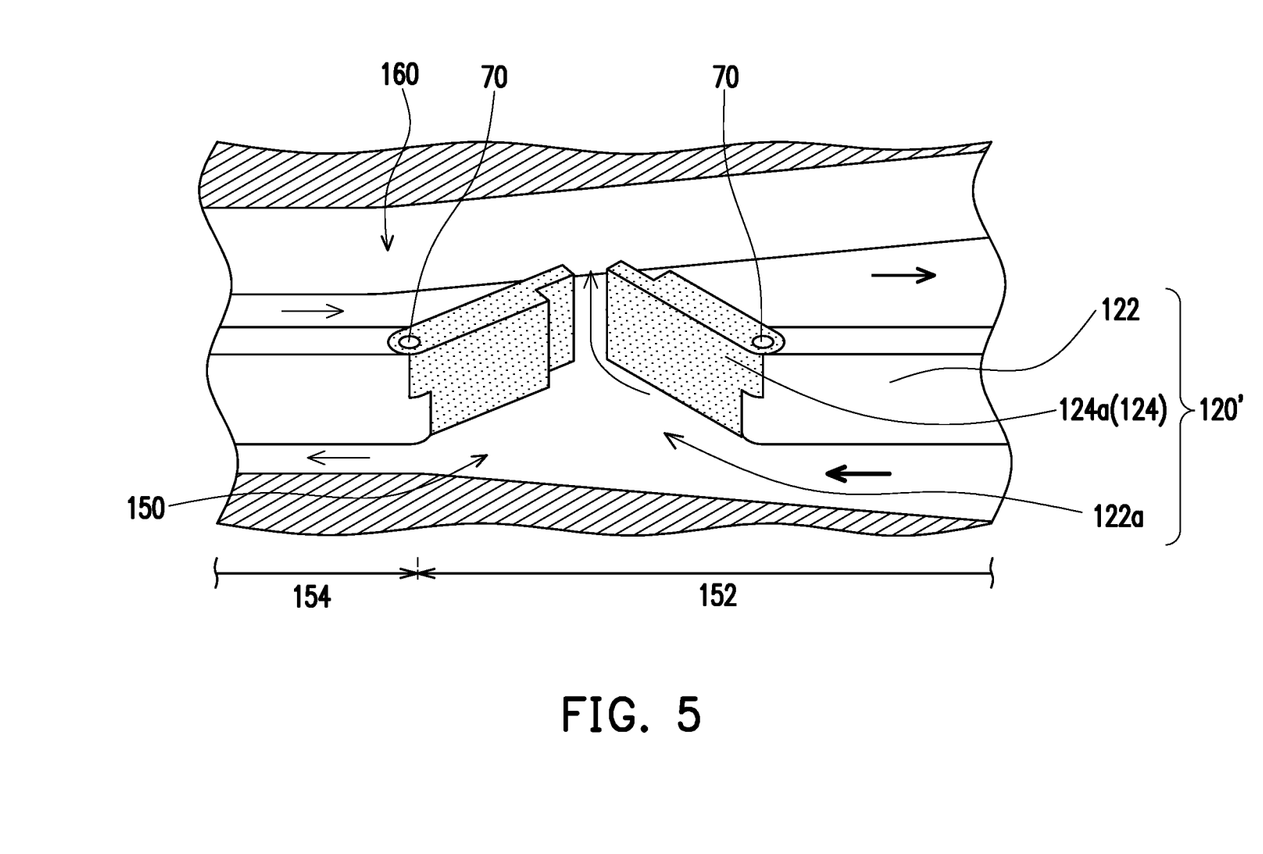
FIG. 5 is a partial stereogram of an opened valve structure of a heat dissipation assembly according to another embodiment of the present invention.

FIG. 5 is a partial stereogram of an opened valve structure of a heat dissipation assembly according to another embodiment of the present invention. Referring to FIG. 5, the difference between a partition structure 120' of FIG. 5 and the partition structure 120 of FIG. 3 is that, in the present embodiment, the valve plates 124a of the valve structure 124 are hard valve plates, each valve plate 124a is pivotally connected to the partition wall 122 by a pivoting portion 70, and each valve plate 124a is adapted to be rotated by liquid relative to the partition wall 122 of the partition structure 120'. Certainly, the material of the valve plate 124a may be a flexible material, the valve plate 124a still can be pivotally connected to the partition wall 122 by the pivoting portion 70.

Figure 6:
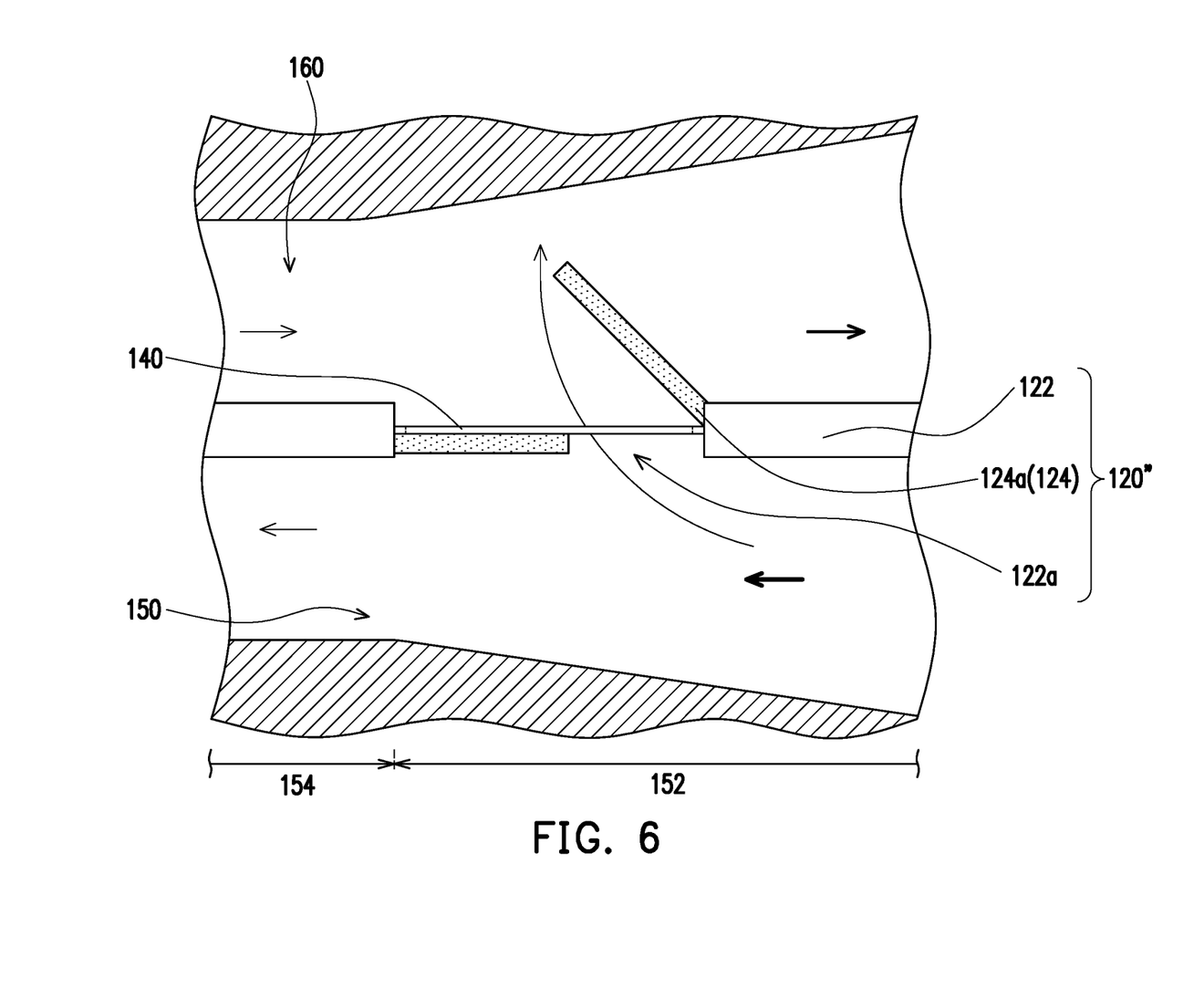
FIG. 6 is a partial top view of an opened valve structure of a heat dissipation assembly according to another embodiment of the present invention.
Figure 7:
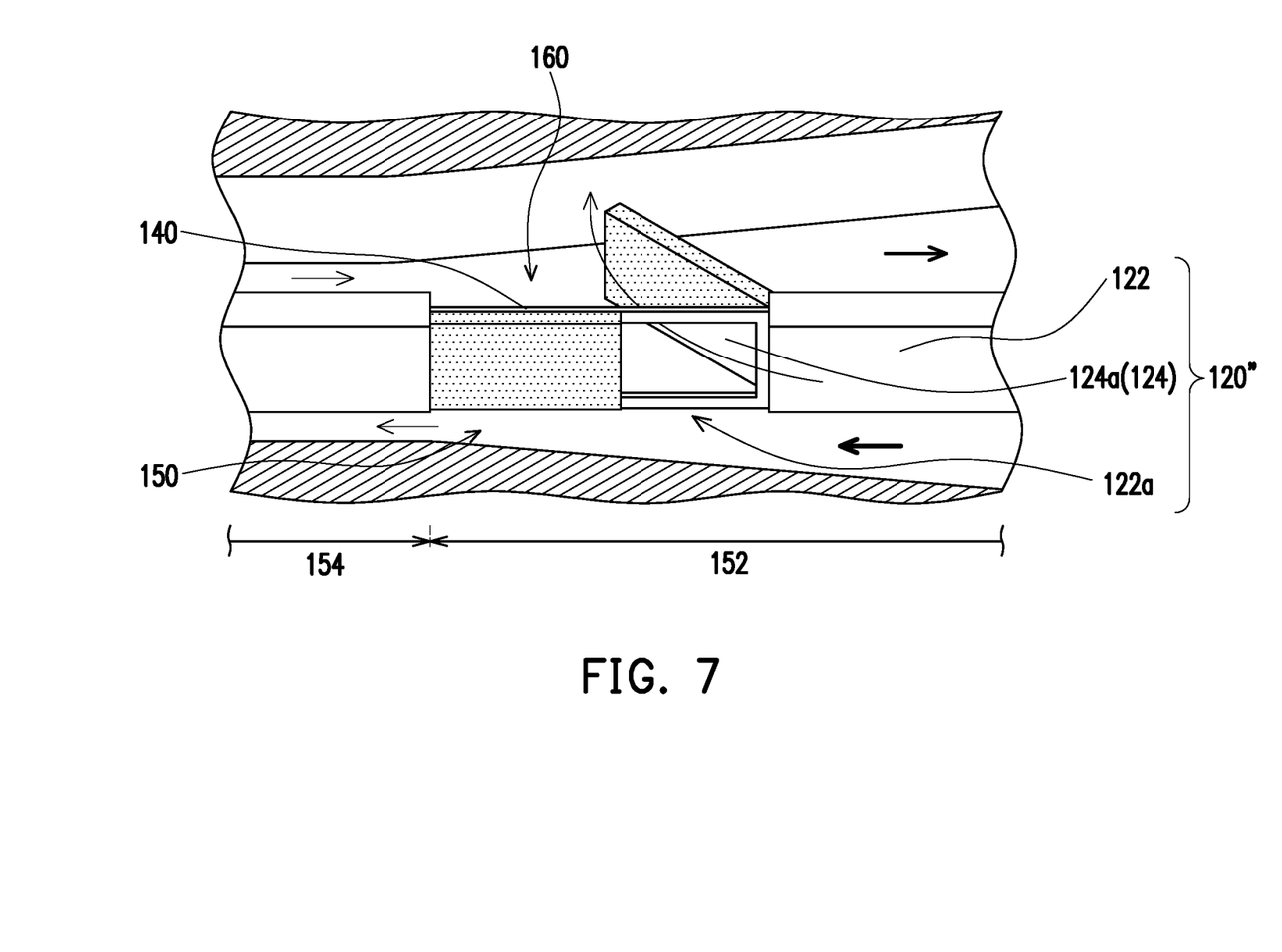
FIG. 7 is a partial stereogram of the opened valve structure of the heat dissipation assembly of FIG. 6.

FIG. 6 is a partial top view of an opened valve structure of a heat dissipation assembly according to another embodiment of the present invention. FIG. 7 is a partial stereogram of the opened valve structure of the heat dissipation assembly of FIG. 6. Referring to FIG. 6 and FIG. 7, the main difference between a partition structure 120" of FIG. 6 and the partition structure 120 of FIG. 3 is that, in the present embodiment, when the valve structure 124 is pushed away, only one valve plate 124a is opened. As shown in the figures, when the pressure of the first flow path 150 is greater than the pressure of the second flow path 160, one of the valve plates 124a will stretch into the second flow path 160 to be opened, while the other valve plate 124a will remain closed.

In the present embodiment, the heat dissipation assembly 100 further includes a second stop structure 140, which may be disposed at the breach 122a of the partition wall 122 and located beside the two valve plates 124a to limit a direction in which the two valve plates 124a are opened. For example, as shown in FIG. 7, in the present embodiment, the second stop structure 140 may be a frame, where the frame (second stop structure 140) allows liquid to pass through and can limit the valve plates 124a, and the two valve plates 124a are respectively disposed on a side of the second stop structure 140 (frame) adjacent to the first flow path 150 and a side of the second stop structure 140 (frame) adjacent to the second flow path 160. Therefore, the frame (second stop structure 140) can be used to limit an opening direction of the two valve plates 124a, so that one of the valve plates 124a can only stretch into the first flow path 150, while the other valve plate 124a can only stretch into the second flow path 160. Of course, in other embodiments, the second stop structure 140 may be designed in other suitable forms, such as a convex shape or a columnar shape. The present invention is not limited thereto.

Besides, in other embodiments, the first stop structure 130 and the second stop structure 140 can also exist at the same time, and can be disposed in the first flow path 150 and the second flow path 160 or at other suitable positions. The present invention is not limited thereto.

Besides, in other embodiments, the shapes of the second sides 128 of the two valve plates 124a may be matched to each other. For example, the matching may be point-symmetric shape configuration, step-like matching as shown in the FIG. 3, or bevel matching, so as to ensure that the valve structure 124 is opened in both directions and can be attached to each other when closed.

Based on the foregoing, the heat dissipation assembly of the present invention is provided with a valve structure on a partition structure separating a first flow path and a second flow path. The valve structure can be pushed away and closed with the magnitudes of liquid pressures in the first flow path and the second flow path. A part of fluid thus flows through a breach to achieve the effect of diversion, thereby reducing a fluid pressure in one of the flow paths and making liquid flow smoothly. Moreover, a part of heat carried by the liquid flowing through a heat source on an original flow path will be discharged out of a chamber in advance via the diversion effect of the valve structure, thereby accelerating partial fluid circulation and improving the heat dissipation efficiency. That is, in the heat dissipation assembly of the present invention, the probability that heat dissipation liquid cannot flow smoothly due to excessive flow resistance can be reduced, and the time for partial fluid circulation can be reduced, thereby ensuring good heat dissipation efficiency of the heat dissipation assembly.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A heat dissipation assembly, comprising:
   a case, comprising a chamber; and
   a partition structure, comprising a partition wall vertically disposed in the chamber to separate a first flow path and a second flow path in the chamber, the partition wall comprising a breach and a valve structure disposed at the breach, wherein
   the valve structure covers the breach when the valve structure is not pushed open, and
   when a fluid pressure existed in a section of one of the first flow path and the second flow path which is adjacent to the valve structure is greater than a fluid pressure existed in a section of the other one of the first flow path and the second flow path which is adjacent to the valve structure, the valve structure is pushed away to expose at least a part of the breach, wherein the valve structure comprises two valve plates, and when the valve structure is pushed away, one of the two valve plates is opened and stretches into the first flow path or the second flow path.

2. The heat dissipation assembly according to claim 1, wherein the first flow path comprises a first section and a second section, a flow path width of the first section of the first flow path is greater than a flow path width of the second section of the first flow path, the valve structure is located at a portion of the first section adjacent to the second section, or the valve structure is located at a boundary between the first section and the second section.

3. The heat dissipation assembly according to claim 1, wherein when the valve structure is pushed away, the other of the two valve plates is also opened, and the two valve plates are opened in the same direction and stretch into the first flow path together or stretch into the second flow path together.

4. The heat dissipation assembly according to claim 1, wherein the other of the two valve plates is also opened, and the heat dissipation assembly further comprises:
   at least one first stop structure, disposed on at least one of the first flow path and the second flow path to limit an angle at which the two valve plates are opened.

5. The heat dissipation assembly according to claim 1, wherein the other of the two valve plates is also opened, and the heat dissipation assembly further comprises:
   at least one second stop structure, disposed beside the two valve plates to limit a direction in which the two valve plates are opened.

6. The heat dissipation assembly according to claim 1, wherein the comprises two valve plates are flexible and fixed to the partition wall.

7. The heat dissipation assembly according to claim 1, wherein the two valve plates are pivotally connected to the partition wall.

8. The heat dissipation assembly according to claim 1, wherein a ratio of a length of each of the valve plates to a flow path width of the first flow path is between 0.2 and 0.6, and a ratio of the length of each of the valve plates to a flow path width of the second flow path is between 0.2 and 0.6.

9. The heat dissipation assembly according to claim 1, wherein the two valve plates are adapted to be moved from a closed position to a maximum open position, each of the valve plates comprises a first side connected to the partition wall and a second side opposite to the first side, a position of the second side when the valve plate is located at the maximum open position and a position of the second side when the valve plate is located at the closed position are spaced by a distance, a ratio of the distance to a flow path width of the first flow path is between 0.2 and 0.6, and a ratio of the distance to a flow path width of the second flow path is between 0.2 and 0.6.

* * * * *